(12) United States Patent
Sartorius et al.

(10) Patent No.: US 9,018,646 B2
(45) Date of Patent: Apr. 28, 2015

(54) FAST PHOTOCONDUCTOR

(75) Inventors: Bernd Sartorius, Berlin (DE); Harald Kuenzel, Berlin (DE); Helmut Roehle, Berlin (DE); Klaus Biermann, Berlin (DE)

(73) Assignee: Fraunhofer-Gesellschaft zur Foederung der angewandten Forschung e.V., Munich (DE)

( * ) Notice: Subject to any disclaimer, the term of this patent is extended or adjusted under 35 U.S.C. 154(b) by 1025 days.

(21) Appl. No.: 12/530,641

(22) PCT Filed: Mar. 10, 2008

(86) PCT No.: PCT/EP2008/001899
§ 371 (c)(1),
(2), (4) Date: Sep. 15, 2010

(87) PCT Pub. No.: WO2008/110329
PCT Pub. Date: Sep. 18, 2008

(65) Prior Publication Data
US 2011/0057206 A1    Mar. 10, 2011

(30) Foreign Application Priority Data
Mar. 15, 2007    (DE) .......................... 10 2007 012 475

(51) Int. Cl.
H01L 27/15    (2006.01)
H01L 31/09    (2006.01)
(Continued)

(52) U.S. Cl.
CPC .......... *H01L 31/09* (2013.01); *H01L 31/03042* (2013.01); *H01L 31/1844* (2013.01); *H01S 1/02* (2013.01); *Y02E 10/544* (2013.01)

(58) Field of Classification Search
USPC ................................ 257/85, E33.077; 438/24
See application file for complete search history.

(56) References Cited

U.S. PATENT DOCUMENTS

| 6,713,832 B2 | 3/2004 | Pardo et al. |
| 2003/0127673 A1 | 7/2003 | Williamson et al. |

(Continued)

FOREIGN PATENT DOCUMENTS

| DE | 102006010297 B3 | 7/2007 |
| EP | 0651448 A1 | 5/1995 |

(Continued)

OTHER PUBLICATIONS

Chen, Yue et al: "Trapping and recombination dynamics of low-temperature-grown InGaAs/InAlAs multiple quantum wells" Jan. 26, 1998; Applied Physics Letters, AIP, American Institute of Phsyics, Melville, NY, vol. 72, No. 4,2626; pp. 439-441, XP012020600ISSN: 0003-6951, the entire document.

(Continued)

*Primary Examiner* — Marvin Payen
(74) *Attorney, Agent, or Firm* — Michael A. Glenn; Perkins Coie LLP

(57) ABSTRACT

A photoconductor comprising a layer stack with a semiconductor layer photoconductive for a predetermined wavelength range between two semiconductor boundary layers with a larger band gap than the photoconductive semiconductor layer on a substrate, wherein the semiconductor boundary layers comprise deep impurities for trapping and recombining free charge carriers from the photoconductive semiconductor layer, and two electrodes connected to the photoconductive semiconductor layer, for lateral current flow between the electrodes through the photoconductive semiconductor layer.

20 Claims, 10 Drawing Sheets

Figure 1:
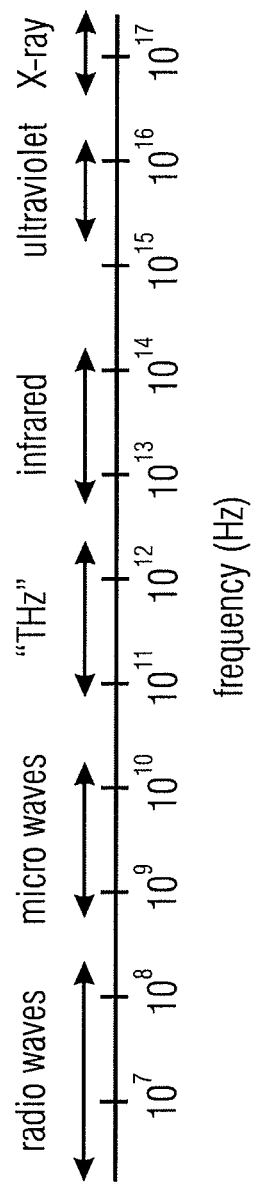

(51) Int. Cl.
*H01L 31/0304* (2006.01)
*H01L 31/18* (2006.01)
*H01S 1/02* (2006.01)

(56) References Cited

U.S. PATENT DOCUMENTS

| | | | |
|---|---|---|---|
| 2006/0214176 | A1 | 9/2006 | Ouchi et al. |
| 2007/0218376 | A1* | 9/2007 | Ouchi .......................... 430/56 |
| 2008/0231384 | A1 | 9/2008 | Sekiguchi et al. |

FOREIGN PATENT DOCUMENTS

| | | |
|---|---|---|
| JP | 2006278366 | 10/2006 |
| JP | 2006279350 | 10/2006 |
| WO | WO98/28656 | 7/1998 |
| WO | WO2006/011668 | 2/2006 |
| WO | WO2006/063233 | 6/2006 |

OTHER PUBLICATIONS

Gupta, S. et al.: "Subpicosecond carrier lifetime in GaAs grown by molecular beam epitaxy at low temperatures"; 1991; Appl. Phys. Lett., ISSN 0003-6951, vol. 59, No. 25, pp. 32763278.

Gupta, S. et al.: "Ultrafast carrier dynamics in III-V semiconductors grown by molecular-beam epitaxy at very low temperatures"; 1992; IEEE Journal of Quantum Electronics, ISSN 0018-9197, vol. 28, No. 10, pp. 2464-2472.

Sartorius B et al: "Telecom components for terahertz applications: LT InGaAs photoconductors for coherent detection close the gap"; Sep. 19, 2007; 33rd European Conference and Exhibition on Optical Communication—ECOC 2007, VDE Verlag, DEBd. 3, 19., pp. Po45/117-118, XP008099970ISBN: 978-3-8007-3042-1, the entire document.

Schomburg E. et al.: "InGaAs/InAlAs superlattice detector for THz radiation"; Mar. 2002; Physica E, vol. 13, No. 2-4, pp. 912-915, XP002511537; Elsevier, Netherlands; Tenth International Conference non Modulated Semiconductor Structures.MSS 10, Jul. 23-27, 2001, Linz, Austria.

Wilk R et al.: "THz Time-Domain Spectrometer Based on LT-InGaAs Photoconductive Antennas Exited by a 1.55 I ¼ m Fibre Laser"; May 2007; CLEO 'Jul. 2007 Conference on Lasers and Electro-Optics Baltimore, MD, USA, Piscataway, NJ, USA, pp. 1-2, XP031231190ISBN: 978-1-55752-834-6, the entire document.

English Translation of International Preliminary Report on Patentability for parallel PCT application, IPRP mailed on Oct. 15, 2009, 10 pages.

Schomburg, et al., "InGaAs/InAlAs superlattice detector for THz radiation", Physica E; Germany; 2002, 912-915.

Adachi, Sadao, "Optical Dispersion Relations for GaP, GaAs, InP, InAs, InSb, $Al_xGa_{1-x}As$, and $In_{t-x}Ga_xAs_yP_{1-y}$", Dec. 15, 1989; American Institute of Physics; Japan, 6030-6040.

Baker, C. et al., "All-Optoelectronic Terahertz System Using Low-Temperature-Grown InGaAs Photomixers", Optical Society of America, Optics Express, vol. 13, No. 23, 2005, Sep. 7, 2005, 6 pp.

Duffy, S. M. et al., "Photomixers for Continuous-Wave Terahertz Radiation", pp. 193-236.

Gregory, I. et al., "Optimization of Photomixers and Antennas for Continuous-Wave Terahertz Emission", IEEE Journal of Quantum Electronics, vol. 41, No. 5, 2005, May 1, 2005, pp. 717-728.

Kunzel, H. et al., "Material Properties of $Ga_{0.47}In_{0.53}As$ Grown on InP by Low-Temperature Molecular Beam Epitaxy", Appl. Phys. Lett., vol. 61, American Institute of Physics, 1992, Sep. 14, 1992, pp. 1347-1349.

Dietz, et al., "THz generation at 1.55 μm excitation: six-fold increase in THz conversion efficiency by separated photoconductive and trapping regions", Optics Express; vol. 19, No. 27, Dec. 19, 2011, 7 pages.

* cited by examiner

FAST PHOTOCONDUCTOR

The present invention relates to a photoconductor and the method for producing the same, wherein the photoconductor can be used, for example, for generating electromagnetic terahertz radiation (THz=terahertz).

Imaging methods play an important role in modern medicine. Here, for example, X-radiation is increasingly used, besides ultrasound and nuclear magnetic resonance. However, the ionizing effect of the high-energy X-radiation presents a health hazard. Since the heat radiation of the human body includes weak portions of THz radiation, an alternative for X-radiation can be seen, for example, in the terahertz range between infrared radiation and microwave radiation. As seen in FIG. 1, the THz range lies approximately between 0.1 and 10 THz. As further fields of usage for THz radiation, for example, monitoring or screening systems for air traffic or further concepts in safety engineering, such as a checking fuel tanks for hidden cracks can be considered.

THz systems can be realized, for example, with so-called femtosecond lasers. These lasers only emit light flashes lasting several femtoseconds (fs). If these short light flashes are directed to a so-called photoconductive antenna of a photoconductive semiconductor material and thin conductive traces deposited thereon, THz radiation can be generated by acceleration of electrons excited by the light pulses.

However, femtosecond lasers are very expensive. A further concept for generating terahertz radiation can be obtained via inexpensive lasers or laser diodes, respectively, by so-called photomixing. For generating THz radiation by photomixing, the principle illustrated in FIG. 2 can be used. There, two almost identical laser diodes are used, that only differ slightly in their emitted light frequencies f1 or f2, respectively. The frequency difference $\Delta f$ between f1 and f2 is adjusted such that the difference frequency $\Delta f$ is in the THz range. By superimposing the two light fields, a frequency beat having the difference frequency $\Delta f$ is obtained. The beat signal is transferred to a so-called photoconductive antenna 20. The photoconductive antenna 20 has a photoconductive semiconductor material, such as GaAs (gallium arsenide) or InGaAs (indium gallium arsenide). Due to the superimposed light and the photo effect, movable electrons are at first generated and then accelerated by a voltage applied via electrodes, whereby electromagnetic radiation in the THz range is emitted. The number of generated charge carriers or electron-hole pairs depends on the intensity of the beat signal, i.e. the number of free charge carriers changes periodically with the frequency of the beat signal. The current in the antenna changes with the beat frequency, and thus, an electromagnetic field 22 having the difference frequency $\Delta f$ lying in the THz range due to appropriate selection of the frequencies of the laser diodes, is emitted.

Figure 3:
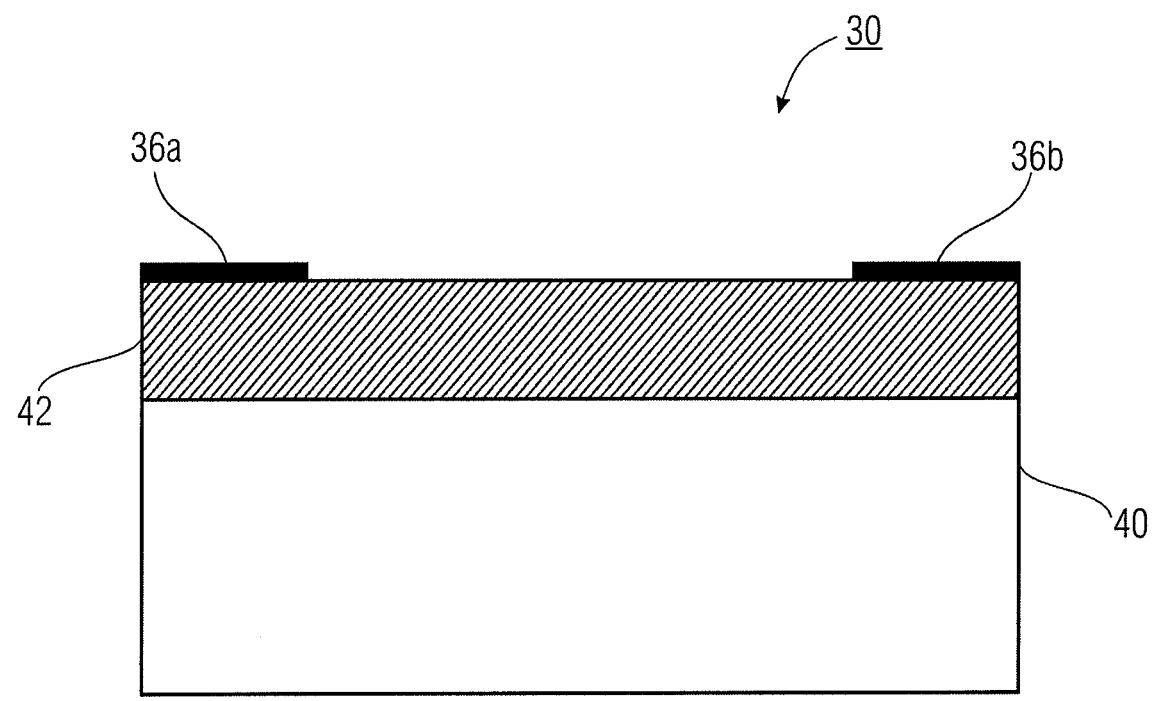

FIG. 3 shows a schematical cross section of a possible photoconductor 30. The photoconductor 30 comprises an insulating or semi-insulating semiconductor substrate 40, respectively, and a photoconductive thin layer 42 deposited on the semiconductor substrate 40. Electrodes 36a,b are deposited on the massive photoconductive semiconductor layer 42. A schematic illustration of a photoconductive antenna 20 or a THz antenna having a photoconductor, respectively, is shown in top view in FIG. 4.

The THz antenna 20 comprises an insulating substrate 40, on which two conductive traces 32a and 32b are deposited. The same can, for example, be lithographically deposited conductive traces of gold. In the so-called H structure shown exemplarily in FIG. 4, the conductive traces 32a and 32b additionally comprise a central ridge, which has, in its center, a gap of several μm. In the gap of the central ridge, a massive photoconductive semiconductor layer 42 is deposited on the substrate 40, which is connected in an electrically conductive manner to the two traces 32a and 32b via electrodes 36a,b. Via the electrodes 36a,b or the conductive traces 32a,b, a voltage Ub can be applied for transmit operation.

As has already been described above, light with two frequencies f1 and f2 slightly detuned with respect to each other is focused onto the photoconductive semiconductor layer 42 in the gap of the ridge, such that a beat signal in the THz range results. In the photoconductive semiconductor layer 42, free charge carriers are generated by the radiation, which are captured quickly by crystal lattice defects. Thereby, the charge carrier density is proportional to the light intensity. For transmit operation, an electrical field is applied between the electrodes 36a,b, which accelerates the charge carriers towards the electrodes 36a,b. Thereby, a charge carrier current results between the electrodes 36a,b. Since the light intensity is modulated by the beat signal in THz range, also, an alternating current with THz frequencies results. By this alternating current, an electromagnetic field 22 is generated in the THz range, i.e. THz radiation is emitted via the conductive traces 32a,b. For increasing the efficiency of the THz radiation, a highly resistive silicon lens concentrating the emitted THz radiation can be deposited on its exit area, i.e. the ridge gap.

Figure 4:
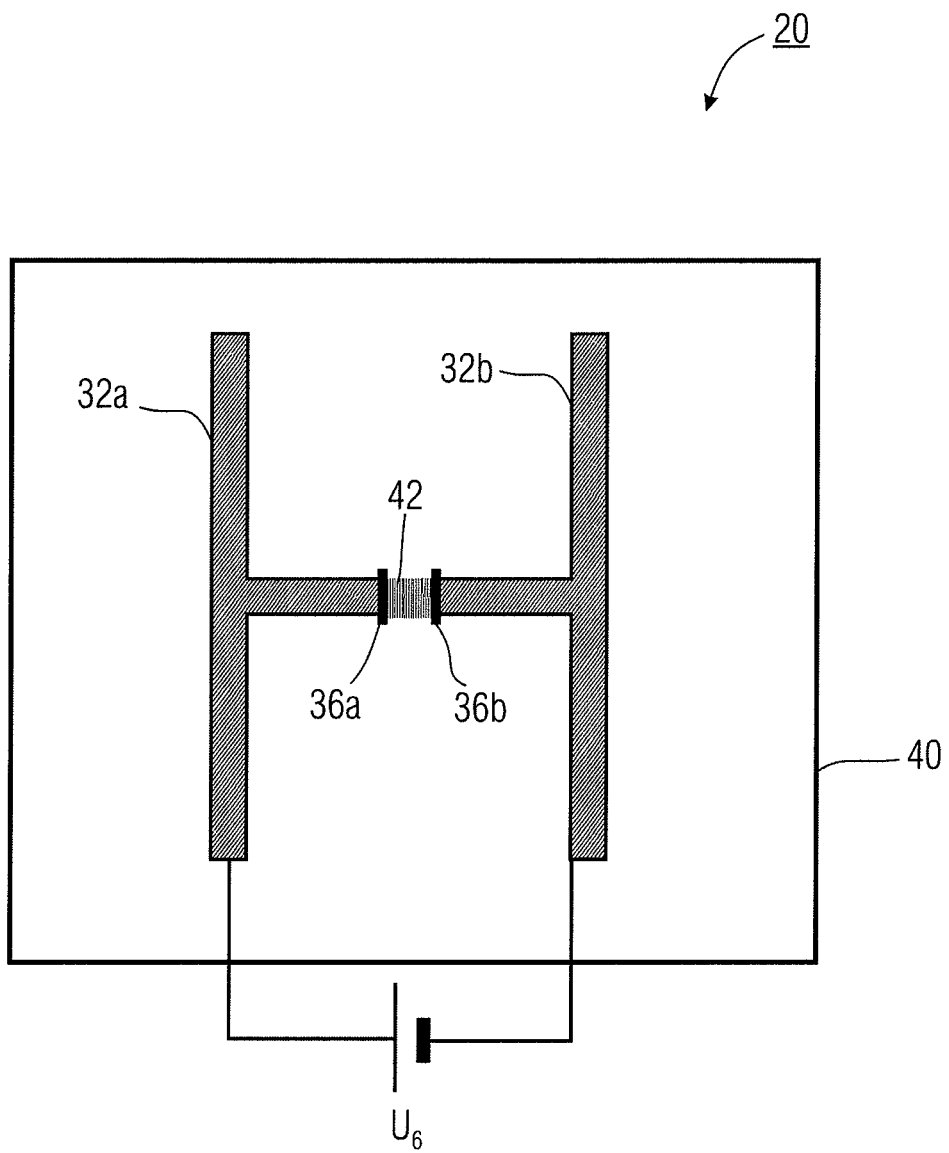

The photoconductive antenna 20 illustrated in FIG. 4 can be used both for transmitting and receiving THz radiation.

For generating and detecting THz radiation by photoconductive antennas or photomixers 20, fast photoconductors having the following characteristics are required:
- electrically insulating in the absence of illumination, i.e. high dark resistance,
- photosensitivity at certain wavelengths,
- high mobility of generated photo charge carriers
- fast decay into the insulating state after switching off the illumination.

Fast decay of the photoconductivity is obtained by introducing point defects representing fast recombination centers into the photoconductive semiconductor layer 42. Prominent examples are so-called LT (low temperature) GaAs layers deposited by molecular-beam epitaxy (MBE) at low temperatures (<200° C.) on GaAs. Molecular-beam epitaxy is a vacuum based depositing method for producing crystalline layers. As consequence of the LT growth, deep impurities result in the form of point defects or impurity clusters, respectively, which cause recombination in the sub-ps range. Hence, LT GaAs is used as standard material for photoconductor based THz antennas (see, for example B. S. Gupta, J. F. Whitaker, G. A. Mourou, "Ultrafast carrier dynamics in III-V semiconductors grown by molecular-beam epitaxy at very low substrate temperatures", IEEE J. Quantum Electron. 28, 2464, (1992) or D. Mittleman (Editor) "Sensing with Terahertz Radiation", ISBN 3-540-43110-1 Springer Verlag Berlin-Heidelberg New York, 2003, chapter "Photomixer for Continuous-Wave Terahertz Radiation of S. M. Duffy, S. Verghese, K. A. McIntosh, pp. 190, and I. S. Gregory, C. Baker, W. R. Tribe, I. V. Bradley, M. J. Evans, E. H. Linfield, A. G. Davies, M. Missous, "Optimization of photomixers and antennas for continuous-wave terahertz emission", IEEE J. Quantum Electronics, Vol. 41, 717 (2005)).

A general disadvantageous consequence of this technology is that the mobility of charge carriers in the photoconductor decreases significantly, since the impurities also act as scattering centers for the free charge carriers. A further negative effect of crystal defects in the semiconductor is that band edges of energy bands become slurred and blurred, such that the absorption behavior at light radiation in this spectral range becomes less favorable.

GaAs is only sensitive and applicable in the spectral range having wavelengths below 850 nm. Thus, a specific problem for the exemplary spectral range having wavelengths of 1 µm to 1.6 µm results from the fact that the starting material InGaAs on InP (indium phosphide) useful as photoconductor partly behaves differently than LT-GaAs during LT growth. On the one hand, the required crystal defects for trapping the electrodes and fast recombination result as well, but in parallel, charge carrier concentration and dark conductivity rise so sharply (see H. Künzel, J. Böttcher, R. Gibis, and G. Urmann, "Material Properties of In0.53 Ga0.47 As on InP by Low-Temperature Molucular Beam Epitaxy" Appl. Phys. Lett. Vol. 61, 1347 (1992)) that a usage, for example in THz antennas, is no longer useful. Thus, for the material system InGaAs on InP, alternative techniques have been developed for generating crystal defects and fast recombination centers, e.g. the implantation of Fe atoms (see M. Suzuki and M. Tonouchi, "Fe-implanted InGaAs photoconductive terahertz detectors triggered by 1.56 µm femtosecond optical pulses", Appl. Phys. Lett., Vol. 86, 163504 (2005) or the bombardment with Br ions (see N. Chimot, J. Mangeney, L. Joulaud, P. Crozat, J. Bernas, K. Blary, and J. F. Lampin, "Terahertz radiation from heavy-ion-irradiated In0.53Ga0.47As photoconductive antenna excited at 1.55 µm" Appl. Phys. Lett. vol. 87, 193510 (2005)). However, comparatively good results as with LT-GaAs have not been obtained, and hence, currently, there are no acceptable THz antennas based on photoconductors for the spectral range at 1.5 µm wavelength, which, on the other hand, is very attractive, since here inexpensive semiconductor lasers and numerous fiber components are available.

LT growth of InGaAs on GaAs has also been tested (C. Baker, I. S. Gregory, M. J. Evans, W. R. Tribe, E. H. Linfield, M. Missous, "All-optoelectronic terahertz system using low-temperature-grown InGaAs photomixers", Optics Express Vol. 13, 9639, (2005)), wherein, however, in this material system, the wavelength area can only be shifted slightly beyond 1 µm, and compared to LT-GaAs considerably poorer characteristics have been obtained.

Hence, it is the object of the present invention to provide a photoconductor with improved characteristics with regard to mobility of charge carriers and dark conductivity, which is also suitable for a wavelength range up to 2 µm.

This object is solved by a photoconductor according to claim 1 and a method for producing a photoconductor according to claim 16.

Further, the present invention provides a photoconductive antenna for transmitting and/or receiving THz radiation based on an inventive photoconductor.

It is the knowledge of the present invention that high mobility of charge carriers and low dark conductivity can be obtained by alternately depositing different semiconductor layers of different composition and different characteristics on an insulating or semi-insulating semiconductor substrate. There, a semiconductor material photoconductive in the desired wavelength range is embedded between semiconductor boundary layers having a larger band gap, i.e. a larger energy gap between valency band and conductivity band, wherein crystal lattice impurities are introduced in the boundary layers for trapping free photo charge carriers and for subsequent fast recombination.

According to one embodiment, the photoconductive semiconductor layer is kept very thin, for example in a range less than 30 nm (nanometer) and even more preferably in a range of less than 20 nm or less than 15 nm. Thereby, free photo charge carriers can reach the adjacent semiconductor boundary layers and their deep crystal lattice impurities perpendicular to the layer level on a short path and thus quickly.

According to embodiments, periodic repetition of the semiconductor boundary layer, the photoconductive semiconductor layer and the semiconductor boundary layer in the semiconductor layer structure is used, which results in a more effective and larger photo effect.

Photoconducting on the one hand and trapping and recombining the photo charge carriers on the other hand are spatially separated due to the arrangement of the semiconductor layers and run in different semiconductor layers. Thus, the different layers can be optimized individually for their respective function, wherein the optimization of one layer does not affect the function of the respective other layer.

Thus, it is an advantage of the present invention that with a photoconductor realized according to the inventive concept comprising different semiconductor layers, high dark resistance, high photosensitivity at certain wavelengths, high mobility of the generated photo charge carriers at light radiation and fast decay into the insulating state after switching off the illumination can be obtained.

Advantageous embodiments and further developments are disclosed in the subclaims.

Figure 2:
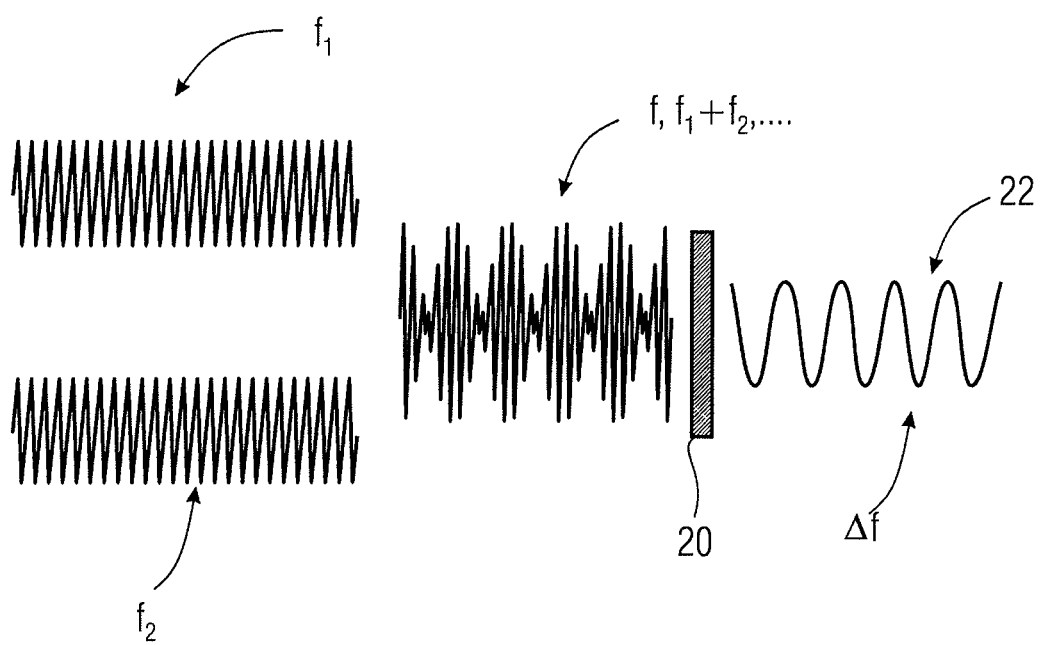
Figure 5:
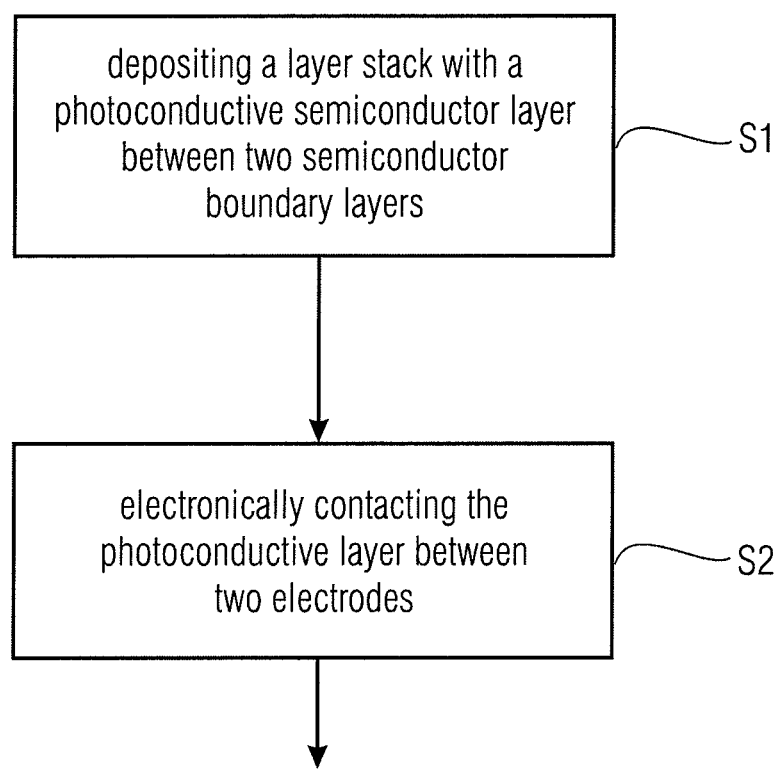
Figure 7:
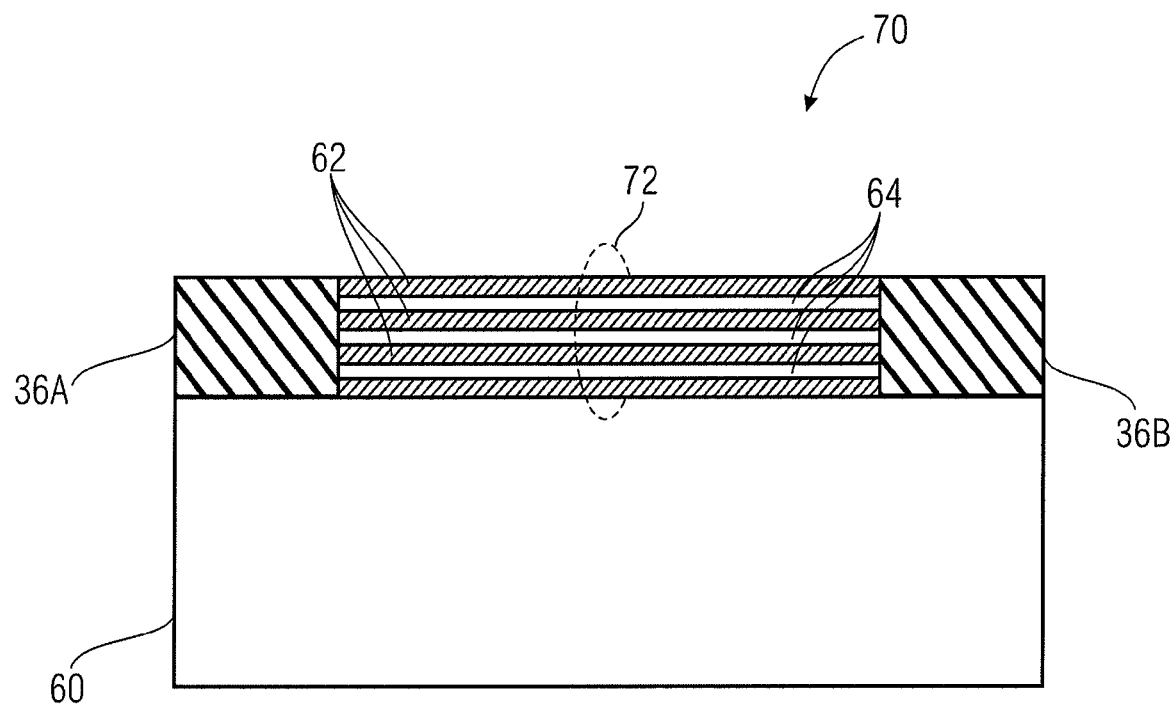
Figure 8:
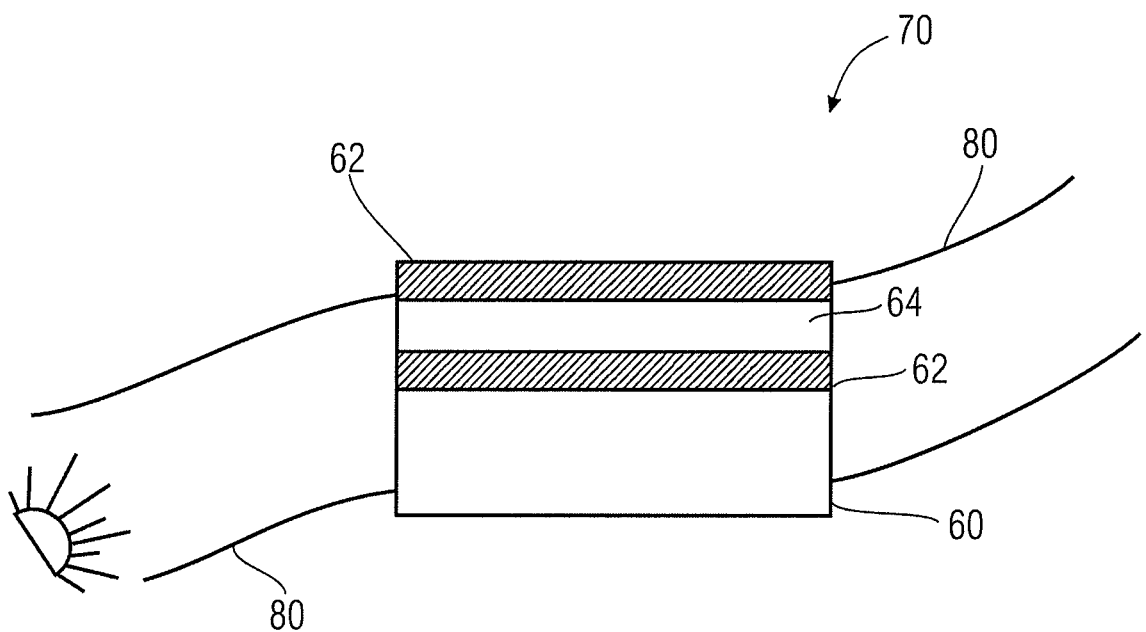
Figure 9:
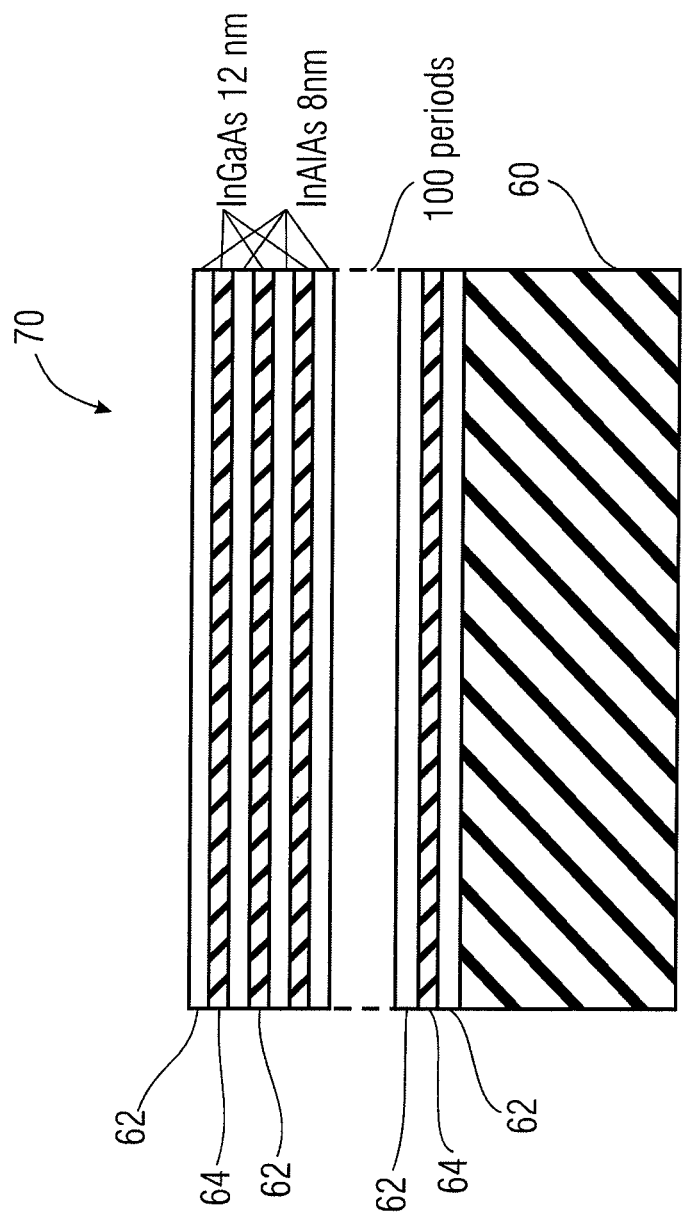
Figure 10C:
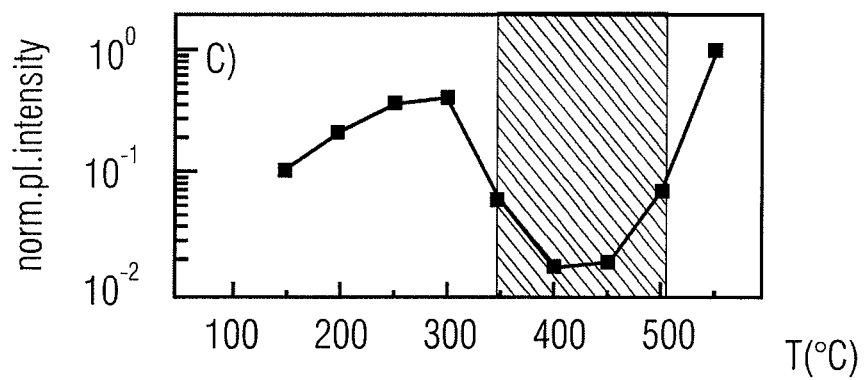
Figure 10B:
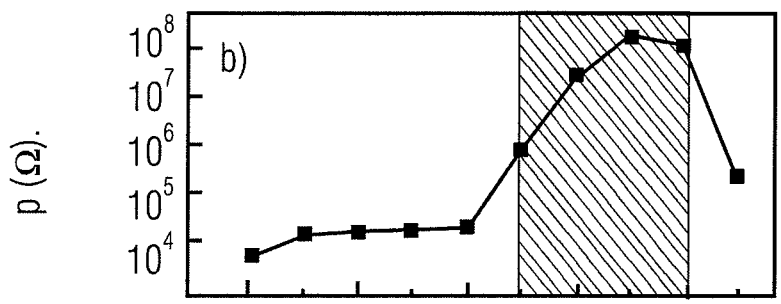
Figure 10A:
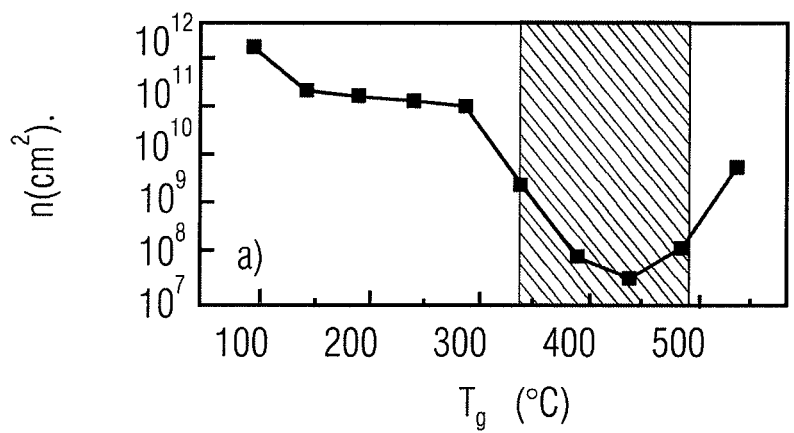

Preferred embodiments of the present invention will be discussed below with reference to the accompanying drawings. They show:

FIG. 1 a schematical illustration of the frequency spectrum for illustrating the position of the THz area;

FIG. 2 a schematical illustration for illustrating a possible generation of THz radiation;

FIG. 3 a cross section of a possible photoconductor structure;

FIG. 4 a schematical illustration of a photoconductive antenna;

FIG. 5 a flow diagram for illustrating a method for producing a photoconductor according to an embodiment of the present invention;

FIG. 6*a-d* illustrations of different method steps for producing a photoconductor according to a further embodiment of the present invention;

FIG. 7 a photoconductor having electrodes according to an embodiment of the present invention;

FIG. 8 a photoconductor structure having a photoconductor layer coupled to optical waveguides according to an embodiment of the present invention;

FIG. 9 a photoconductor having a semiconductor layer stack according to a further embodiment of the present invention; and FIG. 10*a*-10*c* an illustration of different characteristics of InGaAs embedded in InAlAs shown versus the growth temperature.

With regard to the subsequent description, it should be noted that in the different embodiments, the same or equal function elements have the same reference numbers and the descriptions of these function elements are interchangeable in the different embodiments illustrated below.

FIG. 5 shows schematically a flow diagram for illustrating a method for producing a photoconductor according to an embodiment of the present invention.

In a first step S1, a layer stack having a semiconductor layer photoconductive for a predetermined wavelength range between two semiconductor boundary layers having a larger band gap than the photoconductive semiconductor layer is deposited on a substrate, wherein the semiconductor boundary layers have energetically deep impurities for trapping and recombining free charge carriers from the photoconductive semiconductor layer. In a second step S2, the photoconductive semiconductor layer is contacted with two electrodes for lateral current flow between the electrodes through the photoconductive semiconductor layer.

Depositing the layer stack on the substrate in the step S1 will be discussed below in more detail with reference to FIGS. 6a to 6d.

Figure 6A:
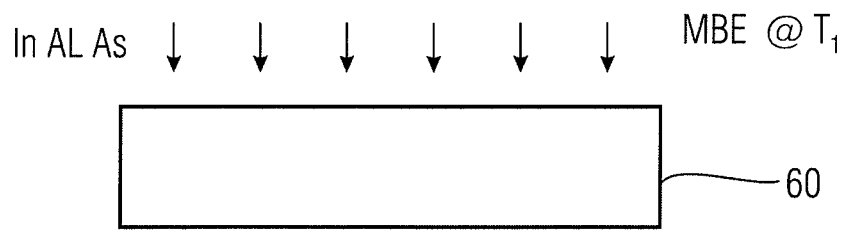

FIG. 6a shows a semiconductor substrate 60, which can be an InP semiconductor substrate (InP=indium phosphide) or a GaAs semiconductor substrate, according to embodiments of the present invention.

In a first step sketched in FIG. 6a, a first semiconductor boundary layer 62 is grown on the semiconductors substrate 60 by epitaxial growth at a first temperature T1. Epitaxial growth is performed by so-called molecular-beam epitaxy (MBE). According to embodiments, the semiconductor material for the first semiconductor boundary layer 62 is InAlAs (indium aluminum arsenide).

Figure 6B:
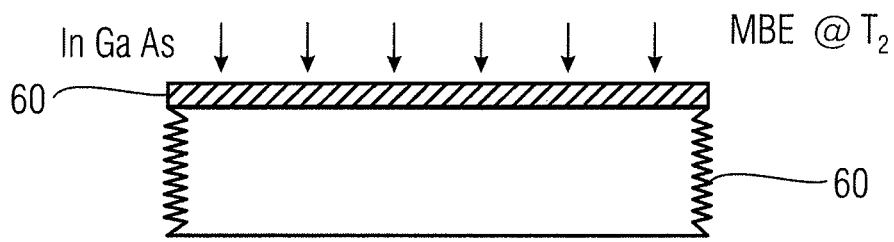
Figure 6C:
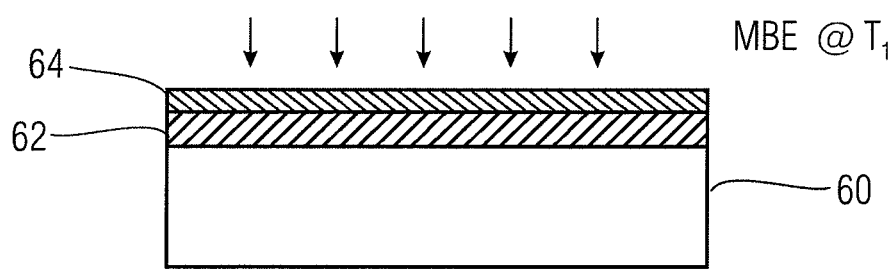

After the first semiconductor boundary layer 62 has been grown by molecular-beam epitaxy on the substrate 60 at the first temperature T1, in a next step shown in FIG. 6b, a photoconductive semiconductor material is grown by molecular-beam epitaxy on the first semiconductor boundary layer 62 at a second temperature T2. According to embodiments, the photoconductive semiconductor layer 64 is a semiconductor layer of InGaAs (indium gallium arsenide) or InGaAsP (indium gallium arsenide phosphide).

In a further step illustrated in FIG. 6c, again, at the first temperature T1, a further semiconductor boundary layer 62 is grown on the photoconductive semiconductor layer 64 by molecular-beam epitaxy. This results in a layer stack with the semiconductor layer 64 photoconductive for the predetermined wavelength range between the two semiconductor boundary layers 62 having a larger band gap than the photoconductive semiconductor layer 64.

According to embodiments, temperatures T1 and T2 are selected, such that the photoconductive semiconductor layer 64 grows at a crystal quality that is as good as possible having few impurities, while deep impurities are specifically introduced in the semiconductor boundary layers 62, which quickly trap free charge carriers from the photoconductive semiconductor layer 62 (preferably in the ps or sub-ps range) and recombine the same.

Apart from the intrinsic physical characteristics of the pure crystal, the electric characteristics of a semiconductor are, significantly determined by energy levels in the gap between conductivity and valency band. These energy levels occur, for example, by specific impurities of the crystal lattice when producing the semiconductor materials. Impurities existing in the lattice can receive electrons from the valency band (acceptors) or emit electrons to the conductivity band (donators). This results in additional holes and electrons, which specifically change the electric characteristics of the semiconductor. If the energy levels of the impurities are approximately in the middle of the forbidden band, these are called deep impurities. At a temperature of approximately 300 K (kelvin), according to embodiments, the deep impurities have a distance of more than or equal to 30 milli-electron volt (meV) to the conductivity and to the valency band.

If the photoconductive semiconductor layer 64 is considered individually, i.e. separate from the semiconductor boundary layers 62, which means in the undisturbed state, the material of the photoconductive semiconductor layer 64 has a certain concentration of the free charge carriers at, for example, 300 K, and the concentration of the deep impurities in the semiconductor boundary layers 62 now has to be equal to or higher than the concentration of the free charge carriers in the photoconductive semiconductor layer 64, i.e. the ratio of deep impurities in the semiconductor boundary layers 62 to the concentration of the free charge carriers in the photoconductive semiconductor layer 64 is preferably higher than or equal to one.

According to one embodiment, the photoconductive semiconductor layer 64 is kept very thin, for example in a range of 3 to 30 nm, such that free photo charge carriers, generated by light radiation, can reach the semiconductor boundary layers 62 and their deep impurities perpendicular to the layer level on a short path and thus quickly.

Figure 6D:
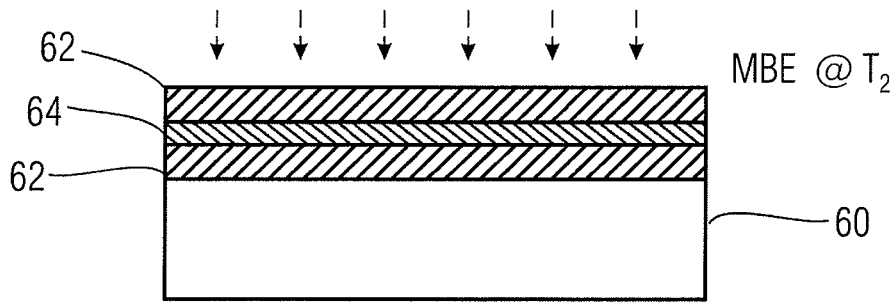

For obtaining a sufficiently effective and large photo effect, the layer sequence of first semiconductor layer boundary layer 62, photoconductive layer 64 and second semiconductor boundary layer 62 can be repeated periodically. With reference to FIG. 6d, this means that a photoconductive semiconductor layer 64 is deposited again on the top semiconductor boundary layer 62 by molecular-beam epitaxy at the temperature T2, followed by a molecular-beam epitaxial growth of a further semiconductor boundary layer 62 at the temperature T1, etc.

Obviously, the layer sequence of semiconductor layers within the layer stack can also be selected differently. For example, first, a photoconductive semiconductor layer 64 could be deposited on the substrate 60, then a semiconductor boundary layer 62 and subsequently again a photoconductive semiconductor layer 64 etc. The same applies for the final layer. The same can either be one of the boundary layers 62 or one of the photoconductive layers 64.

For realizing a photoconductive THz antenna, after or already during production of the layer stack, in particularly the photoconductive semiconductor layers 64 are connected to electrodes in a conductive manner, so that when a voltage is applied to the electrode, and light is radiated in the predetermined wavelength range, lateral current flow between the electrodes through the photoconductive semiconductor layers (64) is enabled.

When using the above mentioned semiconductor materials, i.e. InGaAs or InGaAsP as photoconductive material, and InAlAs for the semiconductor boundary layers 62, the predetermined wavelength range of light where electrodes in the photoconductive layer 64 are risen from the valency band to the conductivity band, lies in a range of 0.5 µm to 2 µm, in particular in a range of 1 µm to 1.6 µm.

A photoconductor structure produced by the above-described method according to an embodiment of the present invention is shown in FIG. 7.

FIG. 7 shows a photoconductor structure 70 on a semiconductor substrate 60 having four semiconductor boundary layers 62, between each of which one photoconductive semiconductor layer 64 is embedded. The layer stack 72 of the semiconductor boundary layers 62 and the photoconductive semiconductor layers 64 is contacted by electrodes 36a,b at opposing sides of the layer stack, for allowing a lateral current flow through the photoconductive semiconductor layers 64 when applying a voltage to the electrodes 36a,b. FIG. 7 shows a preferred variation with periodic layer sequence for a multiplication effect of the thin layers and with a so-called mesa structure with lateral contacts or electrodes 36a,b. By these lateral contacts 36a,b, all layers—even the deeper layers—are to be connected directly to a metal contact, which means a current path can have the same short length everywhere.

In contrary to the embodiment shown in FIG. 7, according to embodiments, both the first electrode 36a and the second electrode 36b could also be connected only to the photoconductive semiconductor layers 64.

If the electrodes 36a,b are each coupled to metallic conductor strips 32a,b, as described with regard to FIG. 4, an inventive THz antenna can be realized with the structures shown in FIG. 7, wherein an inventive photoconductive layer stack 72 replaces the massive photoconductor layer 42. Further, a conventional semiconductor substrate 40 can be replaced or supplemented by a semiconductor substrate 60 according to an embodiment of the present invention, i.e. an InP or GaAs semiconductor substrate. A particular advantage is the already described mesa structure.

By shifting trapping and recombining the photo charge carriers from the photoconductor layer to the adjacent semiconductor boundary layers 62, a high crystalline quality of the photoconductor layer 64 becomes possible, and a high mobility of the free photo charge carriers and a defined band edge can be maintained. It is important that the photoconductive layer 64 is sufficiently thin, so that the free photo charge carriers reach the boundary layers 62 perpendicular to the layer level on a short path and thus very quickly, where they are trapped and subsequently recombined by deep impurities.

Therefore, depending on requirements, very thin layers in the range of several nanometers can be necessary. The light absorption in such a thin radiated layer is low.

Additionally, the efficiency of the photo effect can be significantly improved by two different measures.

For multiplying the effect, a layer packet 72 with alternating thin photoconductive layers 64 and boundary layers 62 with the recombination centers can be used. The effective overall thickness with regard to the light absorption and the photoconductivity is increased, while a thin individual layer each maintains its characteristics.

Radiation can be performed laterally parallel to the layer level, whereby layer thickness and absorption length are basically decoupled from each other. Here, coupling light into a thin layer presents a problem. This, however can be solved when the photoconductive layer 64 is integrated, for example, with an optical waveguide, as schematically shown in FIG. 8.

FIG. 8 shows an inventive photoconductor structure 70 having semiconductor layers 62, 64, 62 deposited on a substrate 60, wherein the photoconductive semiconductor layer 64 is connected on both sides to an optical waveguide 80.

First, an external light signal can be coupled into the (thick) waveguide structure 80 very efficiently. The guided light impinges on the integrated photoconductive layer 64 and is successively and efficiently absorbed.

The two above described methods can also be combined by lateral light radiation into a layer packet 72.

A good photoconductive semiconductor for the spectral range up to 1.65 μm wavelength and with high charge carrier mobility is InGaAs on InP. A particularly suitable material for the semiconductor boundary layers 62 is InAlAs, which can also been grown on InPin a lattice-adapted manner. InAlAs has, as required, a larger band gap than InGaAs, and is thus transparent in the spectral range for wavelengths of more than 1 μm, and shows a very highly insulating behavior, which means generates no current paths in parallel to the photoconductor layer 64. Further, during low temperature growth—similar to GaAs—very effective and fast recombination centers are caused.

A thin photoconductor layer 64 of InGaAs, grown at a temperature T2 above 200° C. and thus with good crystalline quality and mobility, embedded in boundary layers of InAlAs, grown at a temperature T1 below 200° C. and thus showing fast recombination centers, corresponds to a preferred embodiment of the present invention.

The epitaxial growth with varying temperatures T1 and T2, however, makes the production process more difficult. Simplified structures with constant growth temperature, i.e. T1=T2 for the boundary layers 62 and the photoconductive layer 64 are thus also of interest. Here, the preferred boundary layer material InAlAs shows a further interesting characteristic. If InAlAs is grown at temperatures T1 in the range of 350-500° C. by molecular-beam epitaxy, the required trapping and recombination centers will result directly during growth and without further treatment. The simplified growth of an InGaAs/InAlAs layer stack at uniform temperature in this range of 350-500° C. results in good crystalline quality of the photoconductor layer 64 and thus high mobility, and simultaneously the formation of crystal defects in the boundary layers 62 for trapping and recombining the electrons from the photoconductor layer 64.

Analogously to the scheme shown in FIG. 9, photoconductor structures of 100 periods with alternately 12 nm thick InGaAs photoconductor layers and 8 nm thick InAlAs boundary layers have been grown at different constant growth temperatures T=T1=T2 by molecular-beam epitaxy.

FIG. 10a illustrates charge carrier density or concentration, respectively, FIG. 10b specific electric resistance ρ and FIG. 10c integral photoluminescence of an InGaAs photoconductor layer 64 versus the growth temperature T=T1=T2.

It can be seen that by growth in the range 350-500° C. the charge carrier concentration n falls drastically (FIG. 10a) and the specific resistance ρ increases by orders of magnitude (FIG. 10b). The luminescence intensity also drops in this area (FIG. 10c). This is the influence of the boundary layers 62 and the deep impurities in the same on the free charge carriers in the InGaAs photoconductor layers 64. The free charge carriers are trapped away, which causes low charge carrier concentration n and high resistance ρ. The electrons recombine then in a non-radiating manner and quickly across the deep impurities, which can be seen at the low luminescence intensity of InGaAs. The mobility of the electrons in the InGaAs photoconductor layers 64 is influenced only slightly by the impurities in the boundary layers 62. With the structures grown at 400° C., very good electron mobilities of 4000 cm2/Vs could be combined with layer resistances close to 10 MΩ. The embodiment substantiates the function of the inventive concept to shift the deep impurities from the photoconductor layer 64 into the boundary layers 62.

In another embodiment, which is also advantageous because it is realized in a simplified manner at a uniform growth temperature, the InGaAs/InAlAs layer packet is uniformly grown below a temperature of 200° C. The photoconductor layer 64 does not have its optimum mobility, but even under these conditions, the influence of the boundary layers 62 has significant advantages, which has been found experimentally based on a growth series. This growth series has been performed at a temperature of 130° C., and starting from the known InGaAs photoconductors, it has been examined what improvements can be obtained by the inventive concept, i.e. the introduction of thin layers 64 and embedding the same between InAlAs boundary layers 62. In this growth series, the known method of Be doping (Be=beryllium) has been used, wherein the Be doping is constant through the whole layer stack and the same for all grown structures. Here, the Be doping acts as acceptor and partly compensates free electrons.

At identical production conditions and an otherwise comparable structure, it could be determined that only by photoconductor layers 64 becoming thinner as compared to the boundary layers 62, the layer charge carrier concentration of $1*10^{12}$ cm−2 (1 μm thick massive layer) can be reduced via $6*10^{10}$ cm−2 (20 nm thin embedded photoconductor layers) to $2*10^{10}$ cm−2 (12 nm thin embedded photoconductor layers) and 1*1010 cm−2 (6 nm thin embedded photoconductor layers) and correspondingly, the layer resistance can be increased from 50 kΩ/□ or 50 kΩ/sq via 130 kΩ/sq to 600 kΩ/sq and 1.4 MΩ/sq. Massive LT InGaAs layers optimized by Be doping can thus be increased again significantly by an influence of the boundary layers 62. These results are summarized in table 1.

TABLE 1

| material<br>Be doping<br>growth at 130° C. | layer charge carrier<br>concentration<br>N/cm−2 | layer resistance<br>Rs (Ω/sq) |
| --- | --- | --- |
| massive InGaAs | 1012 | 50.000 |
| 20 nm InGaAs/InAlAs | 6 * 1010 | 130.000 |
| 12 nm InGaAs/InAlAs | 2 * 1010 | 600.000 |
| 6 nm InGaAs/InAlAs | 1 * 1010 | 1.400.000 |

In other words, a layer resistance of a given material—here InGaAs—can be increased by one to two orders of magnitude—here from 50.000 Ω/sq to 1.400.000 Ω/sq—by embedding the material as thin layer between semiconductor boundary layers having a higher band gab and deep impurities.

Antennas or conductive traces for emission and reception of THz radiation can be deposited on the inventive photoconductor structure illustrated in FIG. 9 having 12 nm photoconductor thickness, 8 nm boundary layer thickness and 100 periods. The antennas can be used, for example, in a so-called time domain spectrometer with pulse excitation at 1.55 μm, and THz emission and detection for frequencies up to beyond 2 THz can be demonstrated.

With these results, inventive InGaAs photoconductors with InAlAs boundary layers represent a breakthrough in photoconductive THz antennas for the wavelength range at 1.55 μm. With the inventive concept, photoconductors for generating and detecting THz radiation by photoconductive antennas or photomixers can be provided, which are electrically insulating without illumination, and have high photosensitivity in the predetermined wavelength area, high mobility of generated photo charge carriers and fast decay into the insulating state after switching off the illumination.

Finally, it should be noted that the present invention is not limited to a described structure or the discussed method for production, since structure and production of the photoconductor structure can vary. The used terms are merely intended for describing specific embodiments and are not used in a limiting sense. If singular or indefinite articles are used in the description, the same relate also to the plurality of these elements, as long as the overall context does not clearly signify anything else. The same applies vice versa.

The invention claimed is:

1. A photoconductor comprising:
a layer stack comprising a semiconductor layer photoconductive for a predetermined wavelength range between two semiconductor boundary layers with a larger band gap than the photoconductive semiconductor layer on a substrate, wherein the semiconductor boundary layers comprise deep impurities for trapping and recombining free charge carriers from the photoconductive semiconductor layer, and wherein the photoconductive semiconductor layer has a thickness in a range of less than 30 nm; and
two electrodes connected to the photoconductive semiconductor layer for lateral current flow between the electrodes through the photoconductive semiconductor layer,
wherein the photoconductive semiconductor layer has higher crystal quality and/or is less doped with deep impurities than the two semiconductor boundary layers.

2. The photoconductor according to claim 1, wherein the semiconductor boundary layers have a concentration of the deep impurities, which is higher than or equal to a concentration of free charge carriers in the photoconductive semiconductor layer without an effect of the semiconductor boundary layers.

3. The photoconductor according to claim 1, wherein the layer stack is a periodical repetition of a photoconductive semiconductor layer between two semiconductor boundary layers.

4. The photoconductor according to claim 1, wherein the layer stack is implemented as a mesa structure with lateral contacting of the photoconductive semiconductor layer by the electrodes.

5. The photoconductor according to claim 1, wherein the predetermined wavelength range is in a range of 0.5 μm to 2 μm.

6. The photoconductor according to claim 1, wherein the substrate is an InP or GaAs semiconductor substrate.

7. The photoconductor according to claim 1, wherein the photoconductive semiconductor layer comprises an InGaAs or InGaAsP semiconductor material.

8. The photoconductor according to claim 1, wherein the photoconductive layer is coupled to an optical waveguide, so that light can be radiated laterally into the photoconductive layer via the optical waveguide.

9. The photoconductor according to claim 1, wherein the semiconductor boundary layers comprise an InAlAs semiconductor material.

10. An antenna for emitting and receiving terahertz radiation comprising a photoconductor according to claim 1 or claim 2 or claim 3 or claim 4 or claim 5 or claim 6 or claim 7 or claim 8 or claim 9, wherein the electrodes of the photoconductor are connected to conductive traces of the antenna.

11. The photoconductor according to claim 1, wherein the photoconductive semiconductor layer is substantially not doped with deep impurities compared to the two semiconductor boundary layers.

12. The photoconductor according to claim 11, wherein a distance between the two semiconductor boundary layers is less than 30 nm.

13. The photoconductor according to claim 11, wherein the free charge carriers in the photoconductive semiconductor layer reach the two semiconductor boundary layers where the free charge carriers are trapped by the deep impurities and recombine.

14. The photoconductor according to claim 1, wherein a distance between the two semiconductor boundary layers is less than 30 nm.

15. The photoconductor according to claim 1, wherein the free charge carriers in the photoconductive semiconductor layer reach the two semiconductor boundary layers where the free charge carriers are trapped by the deep impurities and recombine.

16. The photoconductor according to claim 2, wherein the photoconductive semiconductor layer is substantially not doped with deep impurities compared to the two semiconductor boundary layers.

17. The photoconductor according to claim 16, wherein a distance between the two semiconductor boundary layers is less than 30 nm.

18. The photoconductor according to claim 16, wherein the free charge carriers in the photoconductive semiconductor layer reach the two semiconductor boundary layers where the free charge carriers are trapped by the deep impurities and recombine.

19. The photoconductor according to claim 2, wherein a distance between the two semiconductor boundary layers is less than 30 nm.

20. The photoconductor according to claim 2, wherein the free charge carriers in the photoconductive semiconductor layer reach the two semiconductor boundary layers where the free charge carriers are trapped by the deep impurities and recombine.

* * * * *